(12) United States Patent
Liu et al.

(10) Patent No.: US 11,582,863 B2
(45) Date of Patent: Feb. 14, 2023

(54) CIRCUIT BOARD COMPONENT AND TERMINAL

(71) Applicant: VIVO MOBILE COMMUNICATION CO., LTD., Guangdong (CN)

(72) Inventors: Guanghui Liu, Chang'an Dongguan (CN); Shiwen Xiao, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 62 days.

(21) Appl. No.: 17/152,638

(22) Filed: Jan. 19, 2021

(65) Prior Publication Data

US 2021/0144842 A1     May 13, 2021

Related U.S. Application Data

(63) Continuation of application No. PCT/CN2019/096084, filed on Jul. 16, 2019.

(30) Foreign Application Priority Data

Jul. 23, 2018    (CN) .......................... 201810811369.9

(51) Int. Cl.
     *H05K 1/02*         (2006.01)
     *H05K 1/18*         (2006.01)

(52) U.S. Cl.
     CPC ............. *H05K 1/025* (2013.01); *H05K 1/181* (2013.01); *H05K 2201/09281* (2013.01); *H05K 2201/10015* (2013.01)

(58) Field of Classification Search
     CPC .................................................... H05K 1/025
     USPC .......................................................... 174/260
     See application file for complete search history.

(56) References Cited

U.S. PATENT DOCUMENTS

| | | | |
|---|---|---|---|
| 2,411,555 A | 11/1946 | Rogers | |
| 6,268,783 B1 * | 7/2001 | Kamiya | H01P 1/2039 333/238 |
| 8,143,526 B2 * | 3/2012 | Hsu | H05K 1/0245 174/254 |
| 2011/0019371 A1 | 1/2011 | Hsu | |
| 2014/0202751 A1 | 7/2014 | Bugg | |
| 2015/0155611 A1 | 6/2015 | Yosui et al. | |

(Continued)

FOREIGN PATENT DOCUMENTS

| | | |
|---|---|---|
| CN | 200969285 Y | 10/2007 |
| CN | 101965096 A | 2/2011 |

(Continued)

OTHER PUBLICATIONS

International Search Report and Written Opinion issued in corresponding application No. PCT/CN2019/096084, dated Feb. 4, 2021.

(Continued)

*Primary Examiner* — Stanley Tso
(74) *Attorney, Agent, or Firm* — Maschoff Brennan

(57) ABSTRACT

Provided are a circuit board component and a terminal. The circuit board component includes: a circuit board and a wire disposed on the circuit board, where the wire includes a first portion and a second portion, a line width of the first portion is greater than or equal to a line width threshold, and a line width of the second portion is less than the line width threshold.

12 Claims, 2 Drawing Sheets

(56) References Cited

U.S. PATENT DOCUMENTS

| | | |
|---|---|---|
| 2018/0042102 A1 | 2/2018 | Choi et al. |
| 2019/0140466 A1* | 5/2019 | Zhang .................. H02J 7/0086 |
| 2019/0341902 A1* | 11/2019 | Yoneda ................ H03H 7/0115 |
| 2020/0235538 A1* | 7/2020 | Liao ........................ H01R 31/02 |
| 2020/0274373 A1* | 8/2020 | Wang ................... H02J 7/0031 |
| 2021/0144842 A1 | 5/2021 | Liu et al. |

FOREIGN PATENT DOCUMENTS

| | | | |
|---|---|---|---|
| CN | 203608194 U | | 5/2014 |
| CN | 103944006 A | | 7/2014 |
| CN | 104508902 A | * | 4/2015 |
| CN | 104508902 A | | 4/2015 |
| CN | 204291587 U | | 4/2015 |
| CN | 206674300 U | | 11/2017 |
| CN | 107635350 A | | 1/2018 |
| CN | 108738228 A | | 11/2018 |
| EP | 3 037 876 A1 | | 6/2016 |
| KR | 20070071358 A | | 7/2007 |

OTHER PUBLICATIONS

Chinese Office Action issued in corresponding application No. 201810811369.9, dated May 28, 2019.
Chinese Office Action issued in corresponding application No. 201810811369.9, dated May 19, 2021.

* cited by examiner

CIRCUIT BOARD COMPONENT AND TERMINAL

CROSS REFERENCE TO RELATED APPLICATIONS

This application is a continuation application of PCT International Application No. PCT/CN2019/096084 filed on Jul. 16, 2019, which claims priority to Chinese patent application No. 201810811369.9 filed in China on Jul. 23, 2018, both disclosures of which are incorporated herein by reference in their entireties.

TECHNICAL FIELD

The present disclosure relates to the field of communications technologies, and in particular, to a circuit board component and a terminal.

BACKGROUND

With the rapid development of terminal technologies, a terminal has become an indispensable tool in people's life, and greatly facilitates various aspects of people's life. The terminal may be affected by high-frequency noise in some circumstances, and some components such as an antenna on the terminal may be affected when the high-frequency noise passes through a line on the terminal.

It can be learned that, some components on the terminal are easily affected when the high-frequency noise passes through the line on the terminal in a related technology.

SUMMARY

Embodiments of the present disclosure provide a circuit board component and a terminal, to resolve a problem that some components on the terminal are easily affected when high-frequency noise passes through a line on the terminal.

To resolve the foregoing technical problem, the present disclosure is implemented as follows:

According to a first aspect, an embodiment of the present disclosure provides a circuit board component, including a circuit board and a wire disposed on the circuit board, where the wire includes a first portion and a second portion, a line width of the first portion is greater than or equal to a line width threshold, and a line width of the second portion is less than the line width threshold.

According to a second aspect, an embodiment of the present disclosure further provides a terminal, including the foregoing circuit board component.

The circuit board component in the embodiments of the present disclosure includes a circuit board and a wire disposed on the circuit board, where the wire includes a first portion and a second portion, a line width of the first portion is greater than or equal to a line width threshold, and a line width of the second portion is less than the line width threshold. In this way, because line widths of some wires are less than a preset line width threshold, high-frequency impedance is improved, and influence exerted by a high-frequency signal on some other components is reduced.

BRIEF DESCRIPTION OF DRAWINGS

To better clarify the technical solution of the embodiments of the present disclosure, the accompanying drawings required to illustrate the embodiments of the present disclosure will be simply described below. Obviously, the accompanying drawings described below merely illustrate some embodiments of the present disclosure. Those ordinarily skilled in the art can obtain other accompanying drawings without creative labor on the basis of those accompanying drawings.

DESCRIPTION OF EMBODIMENTS

The following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of this disclosure without creative efforts shall fall within the protection scope of this disclosure.

Figure 1:
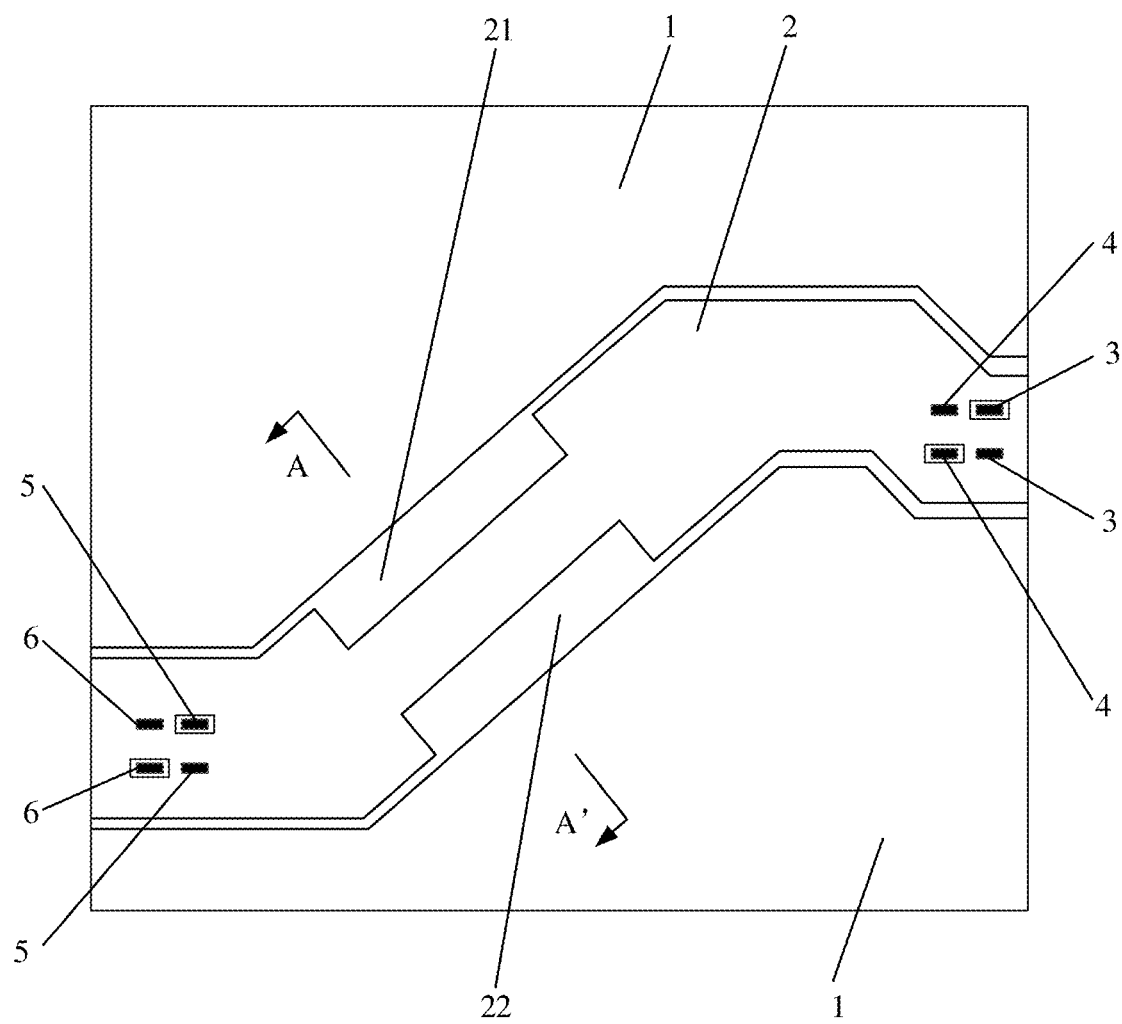
FIG. 1 is a schematic structural diagram of a circuit board component according to an embodiment of the present disclosure.

FIG. 1 is a schematic structural diagram of a circuit board component according to an embodiment of the present disclosure. As shown in FIG. 1, the circuit board component includes a circuit board 1 and a wire 2 disposed on the circuit board 1, where the wire 2 includes a first portion and a second portion, a line width of the first portion is greater than or equal to a line width threshold, and a line width of the second portion is less than the line width threshold.

In this embodiment of the present disclosure, the wire 2 may be a wire between a charging interface and a charging conversion component, or may be a wire of some low-frequency signals, for example, a wire of a camera power network, a wire of a display power network, a wire of a touchscreen power network, or a wire of a fingerprint power network. Because the line width of the second portion is less than the line width threshold, an equivalent coupling capacitance between the wire 2 and the ground is decreased, or even there is no equivalent coupling capacitance, so that high-frequency impedance is improved. Further, because the high-frequency impedance is improved, the wire 2 can well suppress high-frequency noise, so that influence exerted by a high-frequency signal on some other components is reduced.

It should be noted that the line width threshold may be adjusted based on different actual situations. A specific value of the line width threshold is not limited in this embodiment of the present disclosure. In addition, the second portion may exist at any location of the entire wire 2, for example, is located at a middle location of the entire wire 2, or is located on one end of the entire wire, or is located on the other end of the entire wire. This is not limited in this embodiment of the present disclosure.

Based on the circuit board component in this embodiment of the present disclosure, line widths of some wires 2 are less than the preset line width threshold, so that influence exerted by a high-frequency signal on some components can be well reduced, and in addition, costs are very low, so that costs of the terminal can be reduced.

In this embodiment of the present disclosure, the terminal may be a mobile phone, a tablet personal computer (Tablet Personal Computer), a laptop computer (Laptop Computer), a personal digital assistant (personal digital assistant, PDA), a mobile Internet device (Mobile Internet Device, MID), a wearable device (Wearable Device), or the like.

Optionally, the wire 2 is a wire connected between a charging interface and a charging conversion component.

In this implementation, the charging interface may be a USB type-C interface, or may be a micro USB interface. The wire 2 is a wire connected between the charging interface and the charging conversion component. Because the line width of the second portion is less than the line width threshold, an equivalent coupling capacitance between the wire 2 and the ground is decreased, or even there is no equivalent coupling capacitance, so that high-frequency impedance is improved. In addition, because high-frequency impedance is improved, it is very difficult for a high-frequency signal (that is, high-frequency noise) generated by the charging conversion component to reach an antenna by using the wire 2, so that influence exerted by the high-frequency signal on the antenna is reduced, thereby improving receiving sensibility of the antenna.

It should be noted that the antenna may be an upper antenna of the terminal, may be a lower antenna of the terminal, or may include the upper antenna and the lower antenna of the terminal.

Optionally, the circuit board component further includes a first hollow area 21 and a second hollow area 22, and the first hollow area 21 and the second hollow area 22 are respectively on two opposite sides of the second portion.

In this implementation, shapes of the first hollow area 21 and the second hollow area 22 may be the same, or may be different. The shape of the first hollow area 21 or the shape of the second hollow area 22 may be a rectangle, an oval, or some other shapes. This is not limited in this implementation. Due to the existence of the first hollow area 21 and the second hollow area 22, high-frequency impedance of the wire 2 is improved, so that influence exerted on the antenna by a high-frequency signal generated by the charging conversion component can be reduced, and receiving sensibility of the antenna can be improved.

Figure 2:
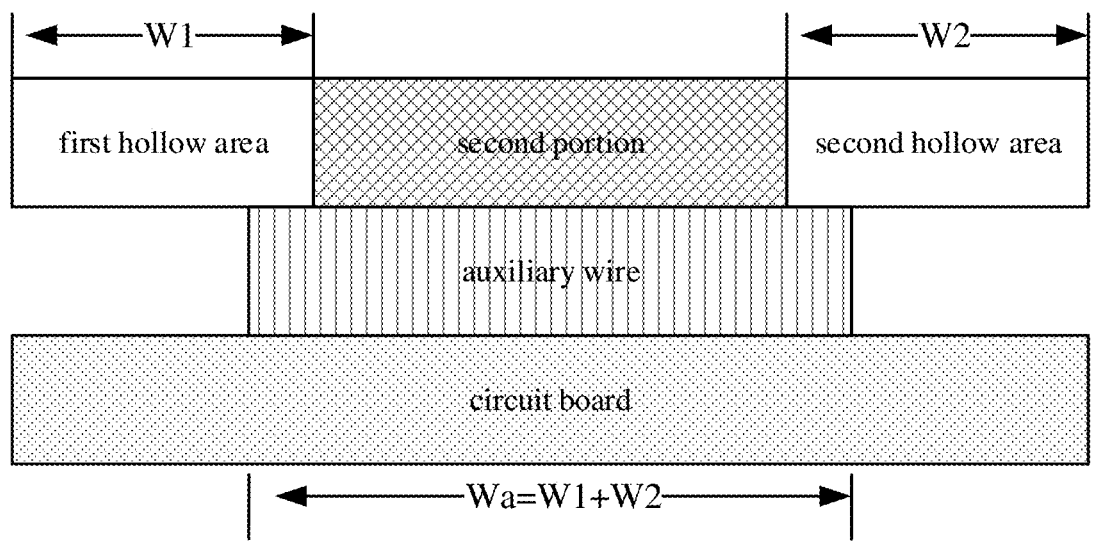
FIG. 2 is a cross-sectional view of FIG. 1 taken along A-A' direction.

Optionally, as shown in FIG. 2, the circuit board component further includes an auxiliary wire disposed between the circuit board 1 and the second portion, and the auxiliary wire is electrically connected to the wire 2.

In this implementation, because line widths of some wires 2 are less than the preset line width threshold, a width of the wire 2 is narrowed, and a direct current resistance is increased. In this way, the auxiliary wire is increased between the circuit board 1 and the second portion, to compensate for the direct current resistance, so that the direct current resistance is not increased. While the direct current resistance is reduced, energy consumption on the direct current resistance is also reduced, so that energy consumption of the terminal can be reduced. Certainly, the auxiliary wire may be disposed at any layer of the circuit board. This is not limited in this implementation.

Optionally, the first hollow area 21 and the second hollow area 22 are each a rectangular area, a length of the first hollow area 21 along an extension direction of the wire is equal to a length of the auxiliary wire, and a line width of the auxiliary wire is equal to a sum of a width of the first hollow area 21 and a width of the second hollow area 22.

As shown in FIG. 2, which is a cross-sectional view of FIG. 1 taken along A-A' direction, a line width (Wa) of the auxiliary wire is equal to a sum of a width (W1) of the first hollow area 21 and a width (W2) of the second hollow area 22.

Figure 3:
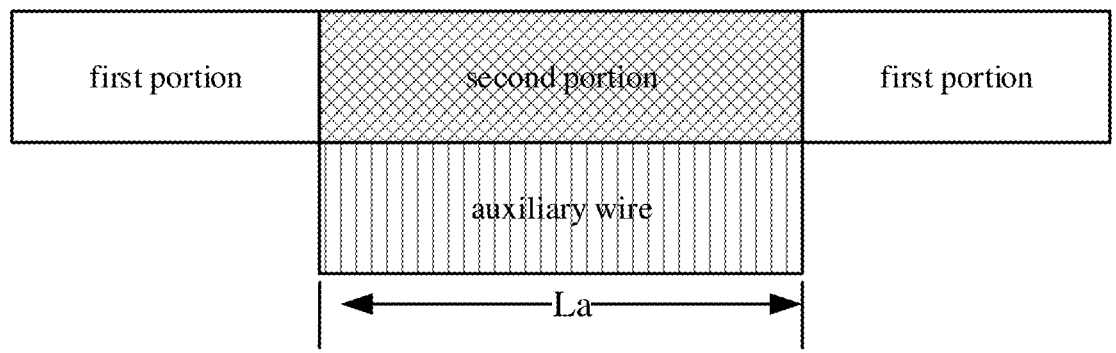
FIG. 3 is a lateral view of the circuit board component shown in FIG. 1.

As shown in FIG. 3, which is a lateral view of the circuit board component shown in FIG. 1, the length (La) of the auxiliary wire is equal to a length of the second portion along the extension direction of the wire. Referring to FIG. 1, the length of the first hollow area 21 along the extension direction of the wire 2 is equal to the length of the second portion along the extension direction of the wire 2. Thus, the length of the first hollow area 21 along the extension direction of the wire 2 is equal to the length (La) of the auxiliary wire. It can be understood that the thickness of the auxiliary wire shown in FIGS. 2-3 is merely for illustration, which is not specifically limited in the present disclosure.

In this implementation, the length of the first hollow area 21 along the extension direction of the wire may be equal to a length of the second hollow area 22 along the extension direction of the wire. The length of the first hollow area 21 along the extension direction of the wire is equal to the length of the auxiliary wire, and the line width of the auxiliary wire is equal to the sum of the width of the first hollow area 21 and the width of the second hollow area 22, thereby compensating for a direct current resistance of the second portion, and ensuring that the direct current resistance of the second portion remains unchanged.

Optionally, the first portion includes a first end and a second end, and the second portion is located between the first end and the second end.

In this implementation, the first end may be an end that is close to the charging conversion component, or may be an end that is close to the charging interface. When the first end is the end that is close to the charging conversion component, the second end may be the end that is close to the charging interface. When the first end is the end that is close to the charging interface, the second end may be the end that is close to the charging conversion component. The second portion is located between the first end and the second end, so that the second portion can have a good impedance function for the high-frequency signal, thereby preventing the high-frequency signal generated by the charging conversion component from affecting the antenna.

Optionally, the circuit board component further includes a first capacitor 3 and a second capacitor 4 that are stuck on the first end, an upper pin of the first capacitor 3 is grounded, a lower pin of the first capacitor 3 is electrically connected to the first end, an upper pin of the second capacitor 4 is electrically connected to the first end, and a lower pin of the second capacitor 4 is grounded.

In this implementation, the upper pin of the first capacitor 3 is grounded, the lower pin of the first capacitor 3 is electrically connected to the first end, the upper pin of the second capacitor 4 is electrically connected to the first end, and the lower pin of the second capacitor 4 is grounded. Therefore, a current loop direction generated by the first capacitor 3 is exactly opposite to a current loop direction generated by the second capacitor 4. When the first capacitor 3 and the second capacitor 4 are close to each other, generated high-frequency magnetic field parts can counteract each other, thereby improving a high-frequency filtering effect, in other words, increasing high-frequency signal insertion loss.

Optionally, the circuit board component further includes a first through-hole located on the upper pin of the first capacitor 3 and a second through-hole located on the lower pin of the second capacitor 4, where the upper pin of the first capacitor 3 is grounded by using the first through-hole, and the lower pin of the second capacitor 4 is grounded by using the second through-hole.

In this implementation, the first through-hole is disposed on the upper pin of the first capacitor 3, so that the upper pin of the first capacitor 3 is grounded by using the first through-hole; and the second through-hole is disposed on the lower pin of the second capacitor 4, so that the lower pin of the second capacitor 4 is grounded by using the second through-hole. Certainly, the grounding herein may mean to be connected to the ground at another layer. This is not limited in this implementation.

Optionally, the circuit board component further includes a third capacitor 5 and a fourth capacitor 6 that are stuck on the second end, where an upper pin of the third capacitor 5 is grounded, a lower pin of the third capacitor 5 is electrically connected to the second end, an upper pin of the fourth capacitor 6 is electrically connected to the second end, and a lower pin of the fourth capacitor 6 is grounded.

In this implementation, the upper pin of the third capacitor 5 is grounded, the lower pin of the third capacitor 5 is electrically connected to the second end, the upper pin of the fourth capacitor 6 is electrically connected to the second end, and the lower pin of the fourth capacitor 6 is grounded. Therefore, a current loop direction generated by the third capacitor 5 is exactly opposite to a current loop direction generated by the fourth capacitor 6. When the third capacitor 5 and the fourth capacitor 6 are close to each other, generated high-frequency magnetic field parts can counteract each other, thereby improving a high-frequency filtering effect, in other words, increasing high-frequency signal insertion loss.

Optionally, the circuit board component further includes a third through-hole located on the upper pin of the third capacitor 5 and a fourth through-hole located on the lower pin of the fourth capacitor 6, where the upper pin of the third capacitor 5 is grounded by using the third through-hole, and the lower pin of the fourth capacitor 6 is grounded by using the fourth through-hole.

In this implementation, the third through-hole is disposed on the upper pin of the third capacitor 5, so that the upper pin of the third capacitor 5 is grounded by using the third through-hole; and the fourth through-hole is disposed on the lower pin of the fourth capacitor 6, so that the lower pin of the fourth capacitor 6 is grounded by using the fourth through-hole. Certainly, the grounding herein may mean to be connected to the ground at another layer. This is not limited in this implementation.

A circuit board component in an embodiment of the present disclosure includes a circuit board 1 and a wire 2 that is disposed on the circuit board 1, where the wire 2 is a wire connected between a charging interface and a charging conversion component, and line widths of some wires 2 are less than a preset line width threshold. In this way, because line widths of some wires 2 are less than the preset line width threshold, high-frequency impedance is improved, and influence exerted by a high-frequency signal on some other components is reduced.

An embodiment of the present disclosure further provides a terminal, including the foregoing circuit board component.

It should be noted that in this specification, the term "include", "including", or any other variant is intended to cover non-exclusive inclusion, so that a process, method, article, or apparatus that includes a series of elements includes not only those elements but also other elements that are not explicitly listed, or includes elements inherent to such a process, method, article, or apparatus. In the absence of more restrictions, an element defined by the statement "including a . . . " does not exclude another same element in a process, method, article, or apparatus that includes the element.

The embodiments of the present disclosure are described above with reference to the accompanying drawings, but the present disclosure is not limited to the foregoing specific implementations. The foregoing specific implementations are merely schematic instead of restrictive. Under enlightenment of the present disclosure, a person of ordinary skills in the art may make many forms without departing from the protection scope of aims of the present disclosure and claims, all of which fall within the protection of the present disclosure.

The invention claimed is:

1. A circuit board component, comprising a circuit board and a wire disposed on the circuit board, wherein the wire comprises a first portion and a second portion, a line width of the first portion is greater than or equal to a line width threshold, and a line width of the second portion is less than the line width threshold;
   wherein the wire is a wire electrically connected between a charging interface and a charging conversion component;
   wherein the circuit board component further comprises an auxiliary wire disposed between the circuit board and the second portion, and the auxiliary wire is electrically connected to the wire;
   wherein the circuit board component further comprises a first hollow area and a second hollow area, and the first hollow area and the second hollow area are respectively on two opposite sides of the second portion;
   wherein the first hollow area and the second hollow area are each a rectangular area, a length of the first hollow area along an extension direction of the wire is equal to a length of the auxiliary wire, and a line width of the auxiliary wire is equal to a sum of a width of the first hollow area and a width of the second hollow area.

2. The circuit board component according to claim 1, wherein the first portion comprises a first end and a second end, and the second portion is located between the first end and the second end.

3. The circuit board component according to claim 2, wherein the circuit board component further comprises a first capacitor and a second capacitor that are stuck on the first end, an upper pin of the first capacitor is grounded, a lower pin of the first capacitor is electrically connected to the first end, an upper pin of the second capacitor is electrically connected to the first end, and a lower pin of the second capacitor is grounded.

4. The circuit board component according to claim 3, further comprising a first through-hole located on the upper pin of the first capacitor and a second through-hole located on the lower pin of the second capacitor, wherein the upper pin of the first capacitor is grounded by using the first through-hole, and the lower pin of the second capacitor is grounded by using the second through-hole.

5. The circuit board component according to claim 2, wherein the circuit board component further comprises a third capacitor and a fourth capacitor that are stuck on the second end, an upper pin of the third capacitor is grounded, a lower pin of the third capacitor is electrically connected to the second end, an upper pin of the fourth capacitor is electrically connected to the second end, and a lower pin of the fourth capacitor is grounded.

6. The circuit board component according to claim 5, further comprising: a third through-hole located on the upper pin of the third capacitor and a fourth through-hole located on the lower pin of the fourth capacitor, wherein the upper pin of the third capacitor is grounded by using the third through-hole, and the lower pin of the fourth capacitor is grounded by using the fourth through-hole.

7. A terminal, comprising the circuit board component according to claim 1.

8. The terminal according to claim 7, wherein the first portion comprises a first end and a second end, and the second portion is located between the first end and the second end.

9. The terminal according to claim 8, wherein the circuit board component further comprises a first capacitor and a second capacitor that are stuck on the first end, an upper pin of the first capacitor is grounded, a lower pin of the first capacitor is electrically connected to the first end, an upper pin of the second capacitor is electrically connected to the first end, and a lower pin of the second capacitor is grounded.

10. The terminal according to claim 9, wherein the circuit board component further comprises a first through-hole located on the upper pin of the first capacitor and a second through-hole located on the lower pin of the second capacitor, wherein the upper pin of the first capacitor is grounded by using the first through-hole, and the lower pin of the second capacitor is grounded by using the second through-hole.

11. The terminal according to claim 8, wherein the circuit board component further comprises a third capacitor and a fourth capacitor that are stuck on the second end, an upper pin of the third capacitor is grounded, a lower pin of the third capacitor is electrically connected to the second end, an upper pin of the fourth capacitor is electrically connected to the second end, and a lower pin of the fourth capacitor is grounded.

12. The terminal according to claim 11, wherein the circuit board component further comprises a third through-hole located on the upper pin of the third capacitor and a fourth through-hole located on the lower pin of the fourth capacitor, wherein the upper pin of the third capacitor is grounded by using the third through-hole, and the lower pin of the fourth capacitor is grounded by using the fourth through-hole.

\* \* \* \* \*